US007525866B2

(12) United States Patent
Russell

(10) Patent No.: US 7,525,866 B2
(45) Date of Patent: Apr. 28, 2009

(54) MEMORY CIRCUIT

(75) Inventor: Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 276 days.

(21) Appl. No.: 11/406,585

(22) Filed: Apr. 19, 2006

(65) Prior Publication Data

US 2007/0247886 A1 Oct. 25, 2007

(51) Int. Cl.
*G11C 8/00* (2006.01)
(52) U.S. Cl. .............................. 365/230.03; 365/189.15; 365/185.13
(58) Field of Classification Search ............ 365/230.03, 365/185, 13, 189, 1, 189.011
See application file for complete search history.

(56) References Cited

U.S. PATENT DOCUMENTS

| 4,654,698 | A | * | 3/1987 | Langworthy | ................ 348/238 |
| 5,949,734 | A | * | 9/1999 | Matano | .................. 365/230.03 |
| 5,959,887 | A | * | 9/1999 | Takashina et al. | ....... 365/185.13 |
| 6,064,621 | A | | 5/2000 | Tanizaki et al. | |
| 6,487,131 | B1 | * | 11/2002 | Clark et al. | .................. 365/201 |
| 6,803,610 | B2 | | 10/2004 | Koolhaas et al. | |
| 2002/0093861 | A1 | * | 7/2002 | Huffman | ..................... 365/201 |

* cited by examiner

*Primary Examiner*—Van Thu Nguyen
*Assistant Examiner*—Han Yang
(74) *Attorney, Agent, or Firm*—James L. Clingan, Jr.; Daniel D. Hill

(57) ABSTRACT

A memory includes a plurality of memory arrays. Each of the plurality of memory arrays includes a plurality of sub-arrays. A plurality of power supply conductors are provided over the memory for supplying power to the plurality of memory arrays. When accessing the memory to simultaneously read a plurality of bits from the memory, the sub-arrays are accessed so as to provide a relatively uniform current demand on the plurality of power supply conductors. In one embodiment, the accessed sub-arrays are organized so that sides, or edges, of each accessed sub-array are not adjacent to each other.

17 Claims, 2 Drawing Sheets

MEMORY CIRCUIT

FIELD OF THE INVENTION

This invention relates to circuits, and more particularly, to memory circuits.

BACKGROUND OF THE INVENTION

Memory circuits have continued to have more and more bits of storage primarily due to the continued scaling of the processes used in making the memory circuits. As this has developed more and more bits per access has become common as has the practice of dividing the memory circuit into more and more blocks. For example a memory of 1 MB (about 8 million bits) may be divided into 64 blocks and each block having 8 subarrays and each access being for 512 bits of data. As the scaling has developed, not just have the dimensions of the smallest feature sizes gotten smaller, the power supply voltages have also gotten smaller. A continuing problem in all of these memories is power supply voltage drop over the memory so that the actual voltage being provided is lower than the power supply voltage. A number of schemes have been developed such as having multiple layers of interconnect over the memory in which the power supply lines are interleaved with signal lines. Another technique that has been proposed is to stagger the accessing of the various memory blocks to reduce the peak IR (current times resistance) drop. An IR drop is a reduction in voltage that occurs when current flows. A higher current causes a higher IR drop and thus more voltage reduction. One of the primary reasons for the transition from aluminum to copper interconnect is to have lower resistance interconnect and thus less IR drop as well as reduced RC (resistance time capacitance) constants.

Thus, at present there is still a need for further improvement in the effects of IR drop for memory circuits.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect, a memory has a plurality of blocks in which one bank of the blocks is accessed for a given access cycle. In order to reduce the drop in voltage for a given location within a bank during an access of that bank, the blocks within a bank are separated so as to avoid high concentrations of current. For the case of the memory being arranged in two banks, the blocks for a given bank are arranged in a checkerboard fashion. The result is that the simultaneous accessing of adjacent blocks is avoided thus increasing the power supply voltage over the situation in which adjacent blocks are simultaneously accessed. This is better understood by reference to the drawings and the following description.

Figure 1:
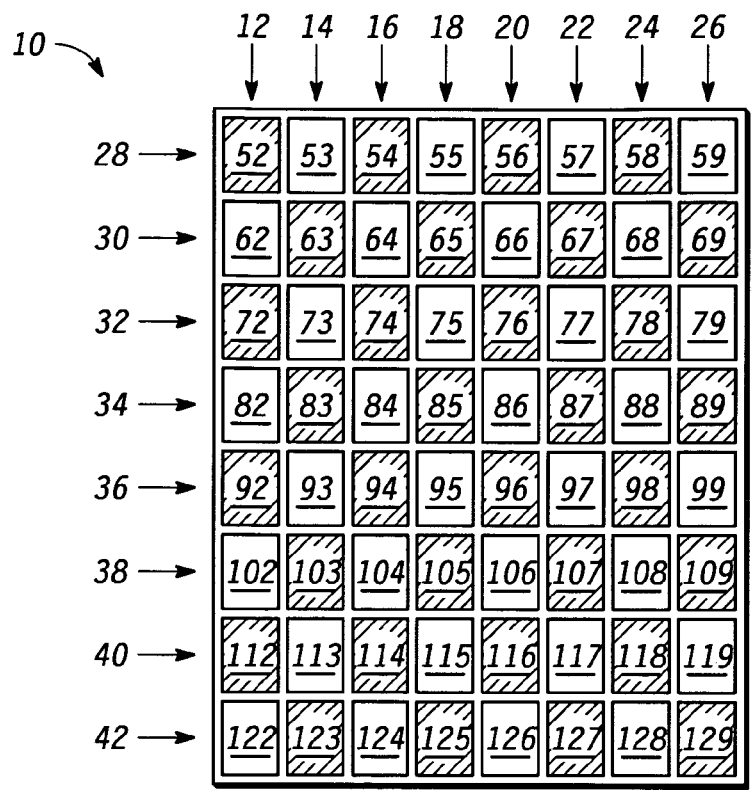
FIG. 1 is a layout of a memory circuit according to an embodiment of the invention.

Shown in FIG. 1 is a memory circuit 10 comprising, in top to bottom order, rows 28, 30, 32, 34, 36, 38, 40, and 42 of memory blocks and, in left to right order, columns 12, 14, 16, 18, 20, 22, 24, and 26 of memory blocks. Each row comprises 8 memory blocks. Similarly each column comprises 8 memory blocks. Row 28 comprises, in left to right order, memory blocks 52, 53, 54, 55, 56, 57, 58, and 59. Row 30 comprises, in left to right order, memory blocks 62, 63, 64, 65, 66, 67, 68, and 69. Row 32 comprises, in left to right order, memory blocks 72, 73, 74, 75, 76, 77, 78, and 79. Row 34 comprises, in left to right order, memory blocks 82, 83, 84, 85, 86, 87, 88, and 89. Row 36 comprises, in left to right order, memory blocks 92, 93, 94, 95, 96, 97, 98, and 99. Row 38 comprises, in left to right order, memory blocks 102, 103, 104, 105, 106, 107, 108, and 109. Row 40 comprises, in left to right order, memory blocks 12, 113, 114, 115, 116, 117, 118, and 119. Row 42 comprises, in left to right order, memory blocks 122, 123, 124, 125, 126, 127, 128, and 129. Column 12, in top to bottom order, memory blocks 52, 62, 72, 82, 92, 102, 112, and 122. Column 14, in top to bottom order, memory blocks 53, 63, 73, 83, 93, 103, 113, and 123. Column 16, in top to bottom order, memory blocks 54, 64, 74, 84, 94, 104, 114, and 124. Column 18, in top to 30 bottom order, memory blocks 55, 65, 75, 85, 95, 105, 115, and 125. Column 20, in top to bottom order, memory blocks 56, 66, 76, 86, 96, 106, 116, and 126. Column 22, in top to bottom order, memory blocks 57, 67, 77, 87, 97, 107, 117, and 127. Column 24, in top to bottom order, memory blocks 58, 68, 78, 88, 98, 108, 118, and 128. Column 26, in top to bottom order, memory blocks 59, 69, 79, 89, 99, 109, 119, and 129. A first bank, shown with cross hatching, comprises memory blocks 52, 54, 56, 58, 63, 65, 67, 69, 72, 74, 76, 78, 83, 85, 87, 89, 92, 94, 96, 98, 103, 105, 107, 109, 112, 114, 116, 118, 123, 125, 127, and 129. A second bank, shown without cross hatching, 53, 55, 57, 59, 62, 64, 66, 68, 73, 75, 77, 79, 82, 84, 86, 88, 93, 95, 97, 99, 102, 104, 106, 108, 113, 115, 117, 119, 122, 124, 126, and 128.

Each of the memory blocks in this example is comprised of 8 subarrays. The number of blocks and subarrays could be a different number. Each subarray is made up of a plurality of memory cells and in this example is made up of about 64 k (thousand) bits. Each access is in response to an address which selects 512 bits from one bank which is 32 blocks in this example. During an access, which can be a read or a write for most memory types, each block is for 16 bits. Thus an access in response to an address is for 32 times 16 (32×16) bits which equals 512 bits. The address comprises 14 bits in this example. As can be discerned from FIG. 1, none of the memory blocks of the first bank are adjacent to each other. Similarly for the second bank; none of the memory blocks are adjacent to each other. The memory blocks of the first bank can be considered to be in a checkerboard pattern so that the memory blocks of a given bank do not have adjacent sides. In this description a block and an array are considered interchangeable. The memory arrays are shown spaced apart indicative of the room required for circuitry for accessing the memory cells within the memory blocks. Such circuitry is well known for one of ordinary skill in the art of memory design.

Figure 2:
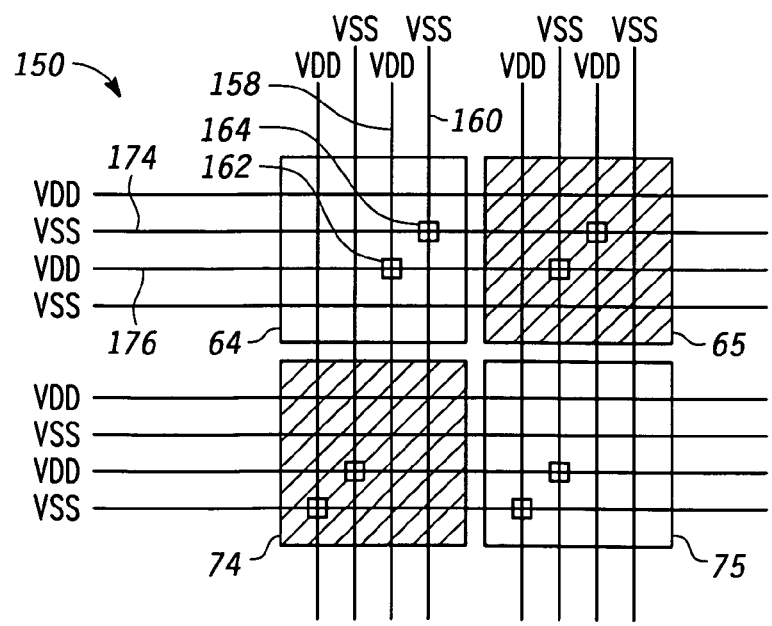
FIG. 2 is a layout of a portion of the memory circuit of FIG. 1 to depict certain features of the memory circuit of FIG. 1.

Shown in FIG. 2 is a portion 150 of memory circuit 10 comprised of memory blocks 64, 65, 74, and 75. Memory blocks 64 and 65 are in row 30. Memory blocks 74 and 75 are in row 32. Memory blocks 64 and 74 are in column 16. Memory blocks 65 and 75 are in column 18. Memory blocks 74 and 65 are in the first bank. Memory blocks 64 and 75 are in the second bank. Further shown in FIG. 2 is a plurality of power supply lines passing over memory blocks 64, 65, 74, and 75. As in a typical memory and also integrated circuits certain metal levels have conductive lines primarily running in one direction and another metal level having conductive lines primarily in an orthogonal direction. For example, the positive power supply (VDD) lines and the negative power supply (VSS) lines are made in different metal lines of the integrated circuit that memory circuit 10 is part of. The conductive lines are contacted from points that are connected more directly to VDD and VSS and ultimately to contacts outside of the integrated circuit. These contacts are shown as squares in FIG. 2. Two examples are contacts 162 and 164. The conductive lines also make contacts to the underlying memory blocks in many locations. These contacts may be only several memory cells apart. Power supply contacts may, for example, be once every sixteen cells.

As shown, four conductive lines run over each block in each direction but there are many more such conductive lines not shown that pass over each block in each direction. What is shown is that the conductive lines do not pass over adjacent blocks that are simultaneously accessed. For example line 174, which is a VSS line, passes over blocks 64 and 65, which are adjacent but are not accessed at the same time because they are in different banks. Line 174 runs in row 30 which has alternating memory blocks in a given bank. Similarly for line 176, which runs in row 30, there are no adjacent blocks for 176 that are accessed at the same time. The effect is that the power supply voltage supplied to an accessed block is not negatively impacted by the current drawn by an adjacent block. Because the power is supplied as a grid of power supply lines, the voltage drop due to IR drop would be greater if adjacent blocks were allowed to be accessed simultaneously. Thus, in the case of memory 10 and as shown for portion 150, the current from the memory blocks that are adjacent to an accessed memory block is minimal because the current drawn by a memory block that is not accessed is minimal.

Figure 3:
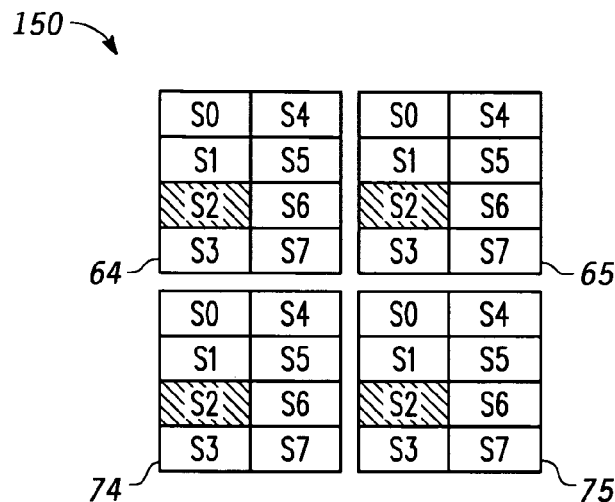
FIG. 3 is a layout of the portion of the memory circuit of FIG. 1 shown in FIG. 2 to depict certain other features of the memory circuit of FIG. 1.

Shown in FIG. 3 is portion 150 with the additional information that the memory blocks further comprise subarrays. Memory blocks 64, 65, 74, and 75 each comprise subarrays S0, S1, S2, and S3 in a left column and subarrays S4, S5, S6, and S7 in right column adjacent to the left column. A first row of subarrays comprises subarrays S0 and S4. A second row of subarrays comprises subarrays S1 and S5. A third row of subarrays comprises subarrays S2 and S6. A fourth row of subarrays comprises subarrays S3 and S7. When the first bank is accessed and the access is to subarray S2, subarrays S2 of memory blocks 74 and 65 are accessed. This shows they are separated by a column of subarrays in the horizontal direction and distance equivalent of four rows in the vertical direction and this distance is maintained by all of the subarrays being accessed. Effectively, the distance between accessed subarrays is substantially the same for all of the accessed subarrays. Thus, the minimum power supply voltage is substantially the same for all of the accessed subarrays and at a value which is the highest possible for them all to be the same. The effect is that the worst case power supply voltage is increased over the case where the accessed memory blocks are adjacent.

Figure 4:
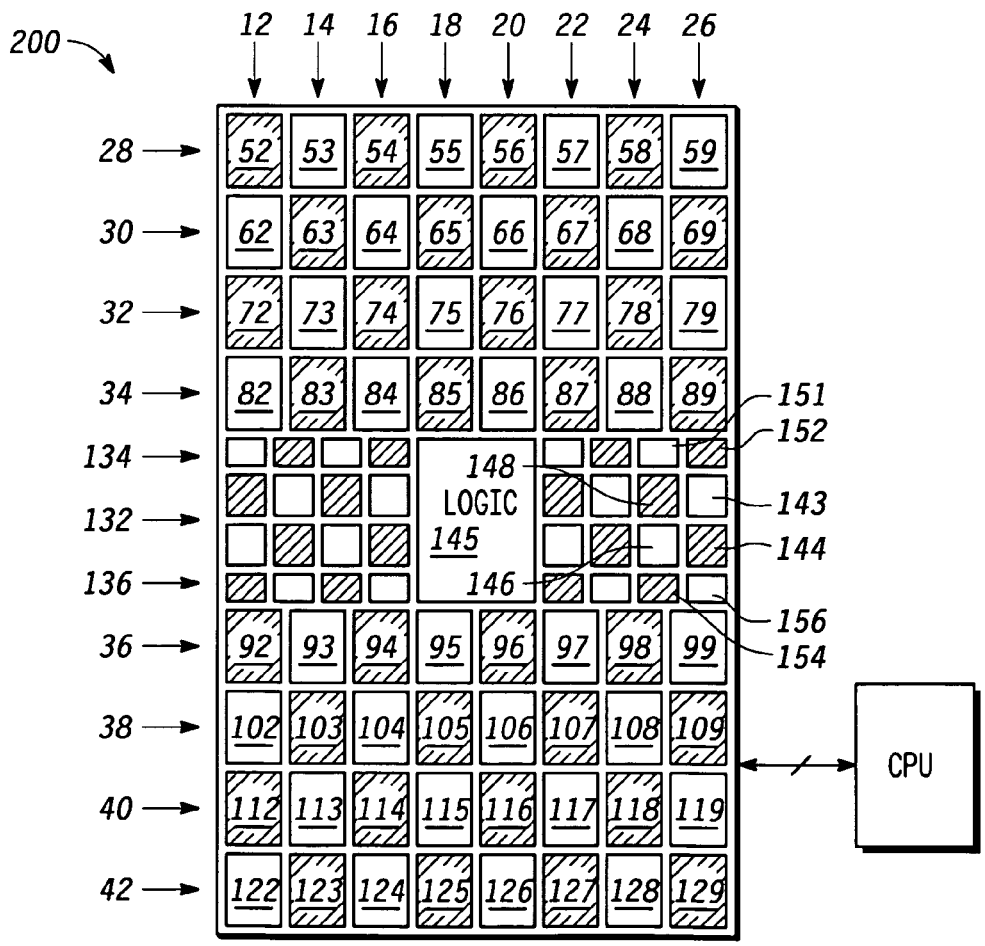
FIG. 4 is memory circuit layout using the features of the memory of FIG. 1 to implement a cache memory.

Shown in FIG. 4 is a cache 200 using the components of memory 10 with additional features useful in making a cache that is coupled to a CPU. Added to memory 10 is logic 145, a TAG 132 between rows 34 and 36, a first status block 134 on a top side of TAG 132, and a second status block 136 on a bottom side of TAG 132. Logic 145 separates TAG 132 into two portions, each portion having 8 blocks. Examples of TAG blocks are blocks 143, 144, 146, and 148 arranged in a square on the right side of logic 145 and along the right side of memory 200. Examples of status blocks are status blocks 151 and 152 above and adjacent to TAG blocks 148 and 143, respectively, and status blocks 154 and 156 below and adjacent to TAG blocks 146 and 144, respectively. The status blocks are alternately in the first bank or the second bank. For example, status blocks 154 and 152 are in the first bank, and status blocks 154 and 156 are in the second bank. Also with regard to the TAG blocks, they are arranged similarly to the memory blocks. For example, TAG blocks 144 and 148 are in the first bank, and TAG blocks 143 and 146 are in the second bank. Thus, it is seen that the status blocks in the first bank are adjacent only to TAG blocks and status blocks in the second bank. This avoids the problems associated with IR drop negatively impacting the power supply voltage due to adjacent blocks or arrays being simultaneously accessed. The ability to use the features of memory 200 as a level 2 cache is well known to one of ordinary skill in cache design.

Memory 200 shows a particular cache that can be implemented using the approach described more generally for memory 10. A cache is generally made of memory cells that are as fast as available, which typically means static random access memory (SRAM) cells. The approach shown in FIG. 10, however, may be applicable to other memory types as well. Memory 10 as well as memory 200 could be another type of memory such as a dynamic random access memory (DRAM), a non-volatile memory (NVM), or another type.

Various other changes and modifications to the embodiments herein chosen for purposes of illustration will readily occur to those skilled in the art. For example, the operation was described for two banks but the principles described can be applied to more than accessing two banks. As a hierarchical description, the highest described was bank, then block, then subarray, but the highest could be array followed by subarray followed by another term such as sub-block. To the extent that such modifications and variations do not depart from the spirit of the invention, they are intended to be included within the scope thereof which is assessed only by a fair interpretation of the following claims.

The invention claimed is:

1. A memory comprising:
   a plurality of memory arrays, each of the plurality of memory arrays comprising a plurality of sub-arrays, wherein when accessing the memory to simultaneously read a plurality of bits from the memory, the plurality of bits are read from more than one of the memory arrays of the plurality of memory arrays in a checkerboard pattern, each memory array of the plurality of memory arrays has sides adjacent to at least two other memory arrays of the plurality of memory arrays, and only sub-arrays having sides that are not adjacent to each other are accessed.

2. The memory of claim 1, wherein the plurality of bits is characterized as being a cache line.

3. The memory of claim 1, further comprising an address for accessing the memory, wherein during an access to the memory, the address selects sub-arrays having a predetermined distance between them, wherein the predetermined distance is chosen to provide a maximum separation between selected sub-arrays.

4. The memory of claim 1, further comprising a plurality of power supply conductors for supplying electrical power to the plurality of memory arrays, wherein the sub-arrays are accessed so as to provide a relatively uniform current demand on the plurality of power supply conductors.

5. The memory of claim 1, wherein the memory is characterized as being an embedded static random access memory.

6. The memory of claim 5, wherein the memory is a level 2 cache and the plurality of memory arrays comprises one or more of a tag array, a status array, and a data array.

7. The memory of claim 1, wherein the memory is implemented with a data processor on an integrated circuit.

8. The memory of claim 1, further comprising a first plurality of power supply conductors for supplying a first power supply voltage to the plurality of memory arrays, and a second plurality of power supply conductors for supplying a second power supply voltage to the plurality of memory arrays.

9. A system comprising:
a processor for executing instructions; and
a memory, coupled to the processor, the memory having a plurality of memory arrays, each of the plurality of memory arrays comprising a plurality of sub-arrays, wherein when accessing the memory to simultaneously read a plurality of bits from the memory, the plurality of bits are read from more than one of the memory arrays of the plurality of memory arrays in a checkerboard pattern, each memory array of the plurality of memory arrays has sides adjacent to at least two other memory arrays of the plurality of memory arrays, and only sub-arrays having sides that are not adjacent to each other are accessed.

10. The system of claim 9, wherein the plurality of bits is characterized as being a cache line for being provided to the processor.

11. The system of claim 9, further comprising an address for accessing the memory, wherein during an access to the memory, the address selects sub-arrays having a predetermined distance between them, wherein the predetermined distance is chosen to provide a maximum separation between selected sub-arrays.

12. The system of claim 9, further comprising a plurality of power supply conductors for supplying electrical power to the plurality of memory arrays, wherein the sub-arrays are accessed so as to provide a relatively uniform current demand on the plurality of power supply conductors.

13. The system of claim 9, wherein the memory is a level 2 cache and the plurality of memory arrays comprises one or more of a tag array, a status array and a data array.

14. The system of claim 9, wherein the memory is implemented with a data processor on an integrated circuit.

15. The system of claim 9, further comprising a first plurality of power supply conductors for supplying a first power supply voltage to the plurality of memory arrays, and a second plurality of power supply conductors for supplying a second power supply voltage to the plurality of memory arrays.

16. A method for accessing a memory, the memory having a plurality of arrays, each of the arrays having a first plurality of sub-arrays, the method comprising:
providing an address to the memory, the address for simultaneously accessing a plurality of bits from the memory; and
selecting a second plurality of sub-arrays in response to the address, wherein the second plurality of sub-arrays is a subset of the first plurality of sub-arrays, each of the second plurality of sub-arrays for storing at least one of the plurality of bits, wherein each selected sub-array of the second plurality of sub-arrays is positioned so that each side of each selected sub-array that is adjacent to a side of a sub-array of the first plurality of subarrays is adjacent to a side of a non-selected sub-array, wherein the arrays that have the second plurality of sub-arrays are in the form of a checkerboard pattern.

17. The method of claim 16, further comprising selecting the second plurality of sub-arrays to provide a maximum separation between the selected sub-arrays.

* * * * *